(12) United States Patent
Kuo

(10) Patent No.: US 7,723,778 B2
(45) Date of Patent: May 25, 2010

(54) 2-BIT ASSISTED CHARGE MEMORY DEVICE AND METHOD FOR MAKING THE SAME

(75) Inventor: Ming-Chang Kuo, Changhua (TW)

(73) Assignee: Macronix International Co., Ltd. (TW)

( * ) Notice: Subject to any disclaimer, the term of this patent is extended or adjusted under 35 U.S.C. 154(b) by 581 days.

(21) Appl. No.: 11/424,781

(22) Filed: Jun. 16, 2006

(65) Prior Publication Data
US 2007/0290256 A1 Dec. 20, 2007

(51) Int. Cl.
*H01L 29/792* (2006.01)
*H01L 29/76* (2006.01)

(52) U.S. Cl. .............. 257/324; 257/314; 257/315; 365/185.14; 365/185.28; 365/185.18

(58) Field of Classification Search .............. 257/324, 257/314, 315; 365/185.14, 185.28, 185.18
See application file for complete search history.

(56) References Cited

U.S. PATENT DOCUMENTS

| 6,888,739 B2 * | 5/2005 | Forbes | 365/149 |
| 7,157,773 B2 * | 1/2007 | Kato et al. | 257/347 |

* cited by examiner

*Primary Examiner*—Kenneth A Parker
*Assistant Examiner*—Joseph Nguyen
(74) *Attorney, Agent, or Firm*—Baker & McKenzie LLP

(57) ABSTRACT

An Assisted Charge (AC) Memory cell comprises a transistor that includes, for example, a p-type substrate with an n+ source region and an n+ drain region implanted on the p-type substrate. A gate electrode can be formed over the substrate and portions of the source and drain regions. The gate electrode can comprise a trapping structure. The trapping structure can be treated as electrically split into two sides. One side can be referred to as the "AC-side" and can be fixed at a high voltage by trapping electrons within the structure. The electrons are referred to as assisted charges. The other side of can be used to store data and is referred to as the "data-side." The abrupt electric field between AC-side and the data-side can enhance programming efficiency. The memory cell can comprise a dual gate structure, such that the cell is a 2-bit cell.

26 Claims, 17 Drawing Sheets

2-BIT ASSISTED CHARGE MEMORY DEVICE AND METHOD FOR MAKING THE SAME

BACKGROUND

1. Field of the Invention

The present invention relates generally to semiconductor memory devices and more particularly to semiconductor memory devices that include an assisted charge.

2. Background of the Invention

Traditional EPROM tunnel oxide (ETOX) flash memory cells and the traditional Nitrided Read Only Memory cells suffer from programming inefficiencies since large currents are generally required to perform a programming operation. ETOX flash and Nitrided Read Only Memory cells are programmed using Channel Hot Electron (CHE) injection to program the cells to a high voltage. Hot electrons are electrons that have gained very high kinetic energy after being accelerated by a strong electric field in areas of high field intensities within a semiconductor device, such as ETOX or Nitrided Read Only Memory semiconductor devices. CHE injection occurs when both the gate voltage and the drain voltage are significantly higher than the source voltage, with $Vg \approx Vd$.

Channel carriers that travel from the source to the drain are sometimes driven towards the gate oxide even before they reach the drain because of the high gate voltage. Injected carriers that do not get trapped in the gate oxide become gate current. The injection efficiency of CHE is small, however, and programming using CHE injection requires large programming current and therefore, CHE injection is inefficient with respect to this wasted current.

Another type of memory cell, a PHINES memory cell, uses Band To Band Hot Hole (BTBHH) injection to program cells to a low voltage. Each PHINES memory cells can store 2 bits per cell. One bit can be stored on the source side of the transistor and one bit can be stored on the drain side of the transistor. In these memory cells each bit can have two states; a high current state that can represent a logic "1" and a low current state that can represent a logic "0".

Each side of the memory cell can be read by sensing the current through the cell and determining if the current is higher or lower than a threshold. The BTB current of an erased cell is higher than the BTB current of a programmed cell. For this reason the state of each side of each cell, programmed or not programmed, can be determined by comparing the current through each side of each cell to a threshold, e.g., a gate to drain or gate to source current threshold.

In a PHINES memory device the charge accumulated on the nitride layer can be erased by a process known as Fowler-Nordheim Injection. During an erase cycle, erase voltages are applied to the source, drain, gate and body of the transistor that cause electrons to tunnel through the bottom oxide barrier of the ONO layer into the nitride layer. These electrons can compensate for the holes injected into the nitride layer during programming. The tunneling through the bottom oxide layer can occur in the presence of a high electric field created as a result of application of the erase voltages to the transistor. The tunneling through the bottom oxide layer is a form of quantum mechanical tunneling.

Programming by BTBHH injection can still be too slow, and can require programming times that are too long, for certain applications.

SUMMARY

An Assisted Charge (AC) Memory cell comprises a transistor that includes, for example, a p-type substrate with an n+ source region and an n+ drain region implanted on the p-type substrate. A gate electrode can be formed over the substrate and portions of the source and drain regions. The gate electrode can comprise a trapping structure the trapping structure can be treated as electrically split into two sides. One side can be referred to as the "AC-side" and can be fixed at a high voltage by trapping electrons within the structure. The electrons are referred to as assisted charges. The other side can be used to store data and is referred to as the "data-side." The abrupt electric field between AC-side and the data-side can enhance programming efficiency.

In one aspect, the memory cell can comprise a dual gate structure, such that the cell is a 2-bit cell.

These and other features, aspects, and embodiments of the invention are described below in the section entitled "Detailed Description."

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION

Figure 1:
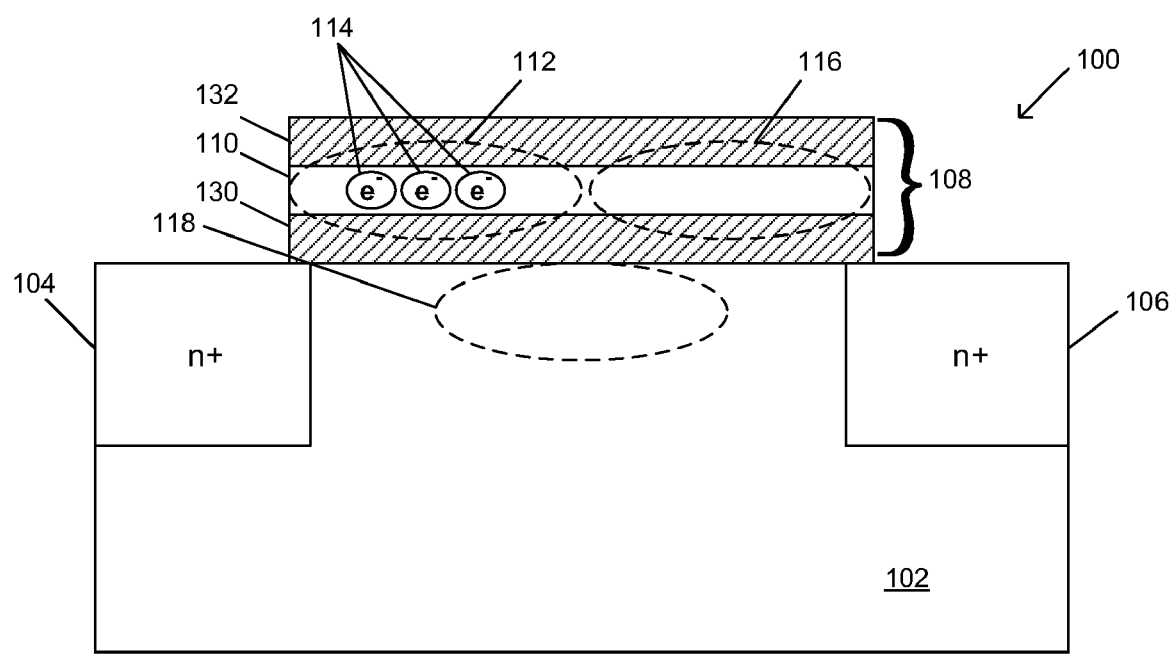
FIG. 1 is a diagram of an Assisted Charge (AC) memory device configured in accordance with one embodiment.

FIG. 1 is a diagram of an Assisted Charge (AC) memory device 100 configured in accordance with one embodiment of the systems and methods described herein. AC-memory device 100 can comprise a transistor that includes a silicon substrate 102. Silicon substrate 102 can serve as a base material that the rest of the memory device 100 can be fabricated on. An Oxide-Nitride-Oxide (ONO) structure 108 can be formed on top of silicon substrate 102. Two n+ regions 104 and 106 can be created by doping silicon substrate 102. These regions 104 and 106 can act as the source and drain, respectively, for the transistor. A polysilicon layer (not shown) can be deposited on top of ONO structure 108 to form the gate electrode of the transistor.

ONO structure 108 can include a nitride (N) layer 110 that can trap charge, sandwiched between two silicon oxide layers 130 and 132. For example, electrons that travel upward through bottom oxide layer 130 can then become trapped within the nitride layer 110. These electrons can form an assist charge, or be used to store data, as described further below. ONO structure 108 is just one example of a charge trapping structure that can be used in accordance with the systems and methods described herein.

ONO structure 108 can, for example, be split into two sides. One side can be referred to as AC-side 112, which can be fixed at a high voltage by trapping assisted charges 114 in the nitride layer 110. The other side can be referred to as data side 116, and can be used to store data. The data can be represented by the voltage level stored in data side 116 and will be described in more detail below.

An abrupt electrical field region 118 can be created between AC-side 112 and data-side 116. Abrupt electrical field 118 can improve programming efficiency by limiting programming current and/or lowering programming times, depending on the embodiment. For example, the high voltage on the AC-side 112 can limit programming current during Hot Electron (HE) programming, as will be described below with respect to FIG. 2A.

Figure 2A:
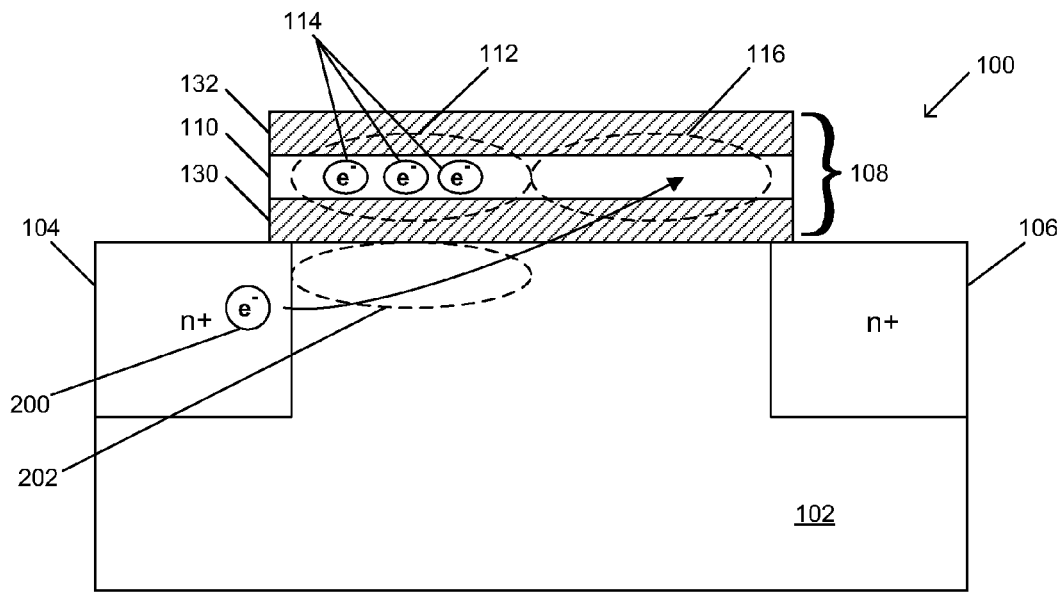
FIG. 2A is a diagram illustrating HE programming of an example AC-memory cell, such as that illustrated in FIG. 1, in accordance with the embodiment.

FIG. 2A is a diagram illustrating HE programming of an example AC-memory cell, such as that illustrated in FIG. 1, in accordance with the embodiment of the systems and methods described herein. In a conventional memory cell, a positive voltage on the gate creates an inversion region near the surface of p-substrate 102. This inversion region is the channel. Electrons flow across the transistor channel from source to drain and some of these electrons are injected into nitride charge trapping layer 110 through bottom oxide layer 130. If 0 volts, or low voltage, is placed on the gate, no electrons, or at least very few, flow into the channel and the source and drain are effectively disconnected. As a result, little or no current flows across the channel, and few if any electrons are trapped in nitride layer 110. Conversely, if a high voltage is applied to the gate then more electrons flow through the channel and more electrons can be trapped in nitride layer 110.

In order to reduce the programming current, AC side 112 of AC-memory device 100 is fixed at a high Vt by trapping electrons 114 known as the assisted charge (AC) in layer 110. AC electrons 114 decrease the number of electrons pulled into area 202 of the channel under AC-side 112, since the negative electric charge of these electrons repels electrons in area 202. This can limit the programming current during HE programming, which reduces the required programming power.

As illustrated in FIG. 2A, when the correct programming voltages are applied, and AC electrons 114 are present, electron 200 can start to flow from source 104 toward drain 106. The flow of electrons can, as described above, be limited by electrons 114 in the AC side 112. In this way the programming current can be reduced. As electron 200 travels from source 104 to drain 106 it will travel through an abrupt electrical field change between AC-side 112 and Data side 116. Some electrons, such as electron 200 will travel through bottom oxide layer 130 into charge trapping nitride layer 110 on data side 116.

During programming, programming voltages can be applied to gate and drain electrodes, while the source electrode is grounded, or tied to 0 volts. For example, a voltage in the range of approximately 4-6 volts can be applied to gate 108. More specifically, a gate voltage between 4.5-5.5 volts can be preferred. A voltage in the range of approximately 3-6 volts can be applied to drain 106. More specifically, a drain voltage of approximately 4-5.5 volts can be preferred. It will be understood that different voltages can be used for different implementations.

Figure 2B:
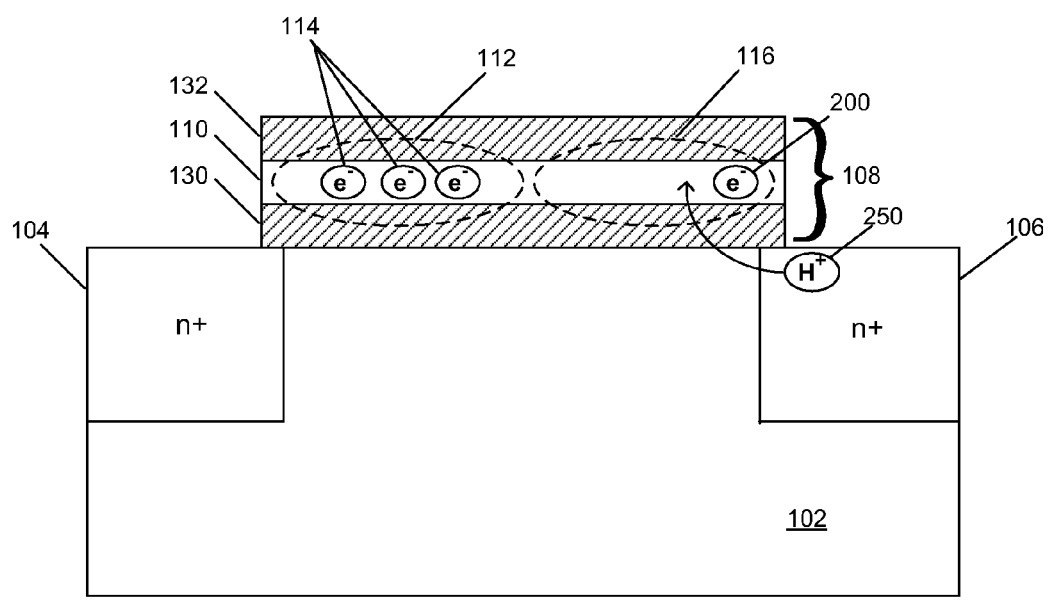
FIG. 2B is a diagram illustrating an erase operation for an example AC-memory cell, such as that illustrated on FIG. 1, in accordance with one embodiment.

FIG. 2B is a diagram illustrating an erase operation for an example AC-memory cell, such as that illustrated in FIG. 1. When erasing AC-memory device 100, holes travel from drain 106 to gate 108 and compensate for electrons 200 trapped in nitride layer 110. Erase voltages can be applied to the gate, drain and source in order to create a voltage difference that will cause holes 250 to flow from drain 106, through oxide layer 130, to nitride layer 110. Holes 250 can compensate for electrons 200 to remove charge from data-side 116. Several of the memory cells can be erased in bulk or by pages or sectors. In this way, the limitations of slower BTBHH can be avoided since many or several cells can be erased at once.

When erasing AC-memory device 100, source 104 can be at ground, while high voltages are applied to drain 106 and the gate 108. For example, a voltage in the range of approximately −7−−10 volts can be applied to gate 108. More specifically a gate voltage of approximately −8−−9 volts can be preferred. A voltage in the range of approximately 4-6 volts can be applied to drain 106. More specifically, a drain voltage in the range of approximately 4.5-5.5 volts can be preferred. It will be understood that these are examples of possible voltages that can be used.

Figure 3:
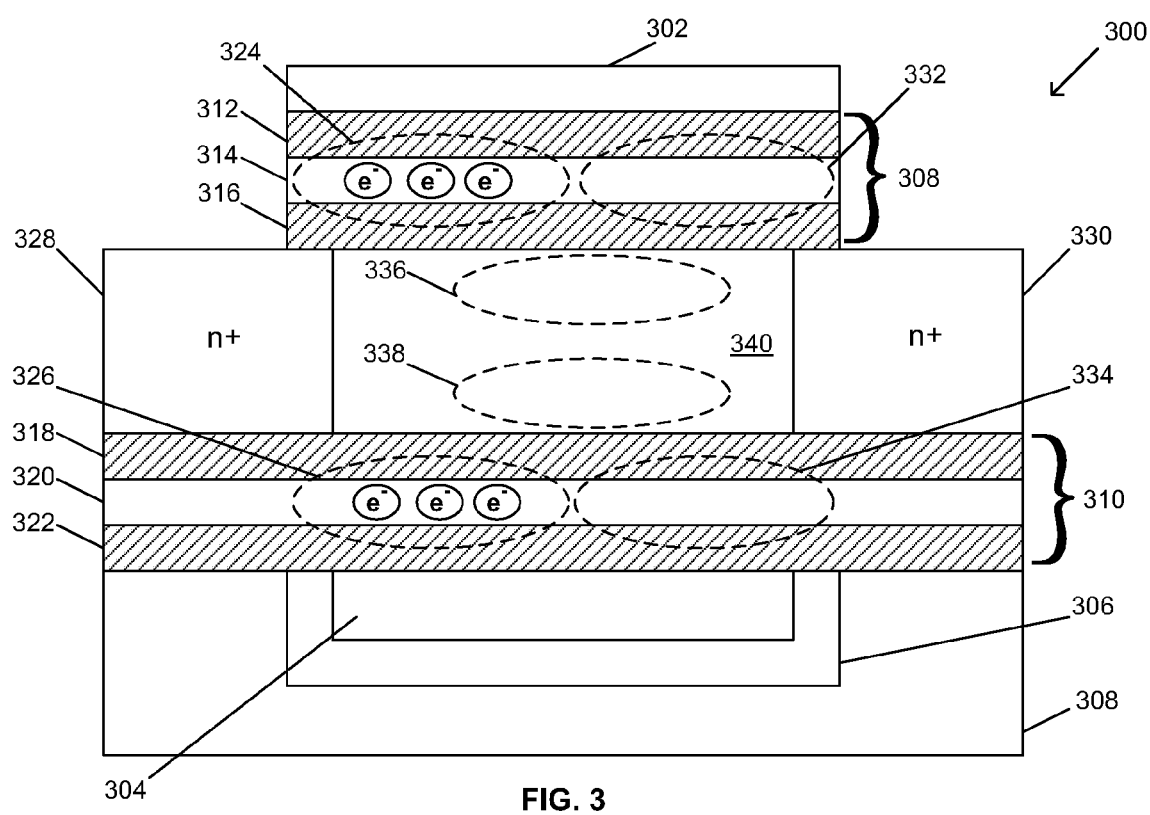
FIG. 3 is a diagram illustrating a 2-bit AC memory device configured in accordance with one embodiment.

FIG. 3 is a diagram illustrating an example 2-bit AC memory cell configured in accordance with one embodiment as described herein. 2-bit AC memory cell 300 comprises two control gates 302 and 304. Control gates 302 and 304 are then separated from a channel region 340 by trapping structures 308 and 310 respectively. In the example of FIG. 3, trapping structure 308 comprises an ONO structure that includes oxide layer 312, nitride layer 314, e.g., a SiN layer, and oxide layer 316. Similarly, trapping structure 310 comprises an ONO structure that includes oxide layer 318, nitride layer 320, e.g., a SiN layer, and oxide layer 322. 2-bit AC memory cell 300 is formed on top of substrate 308, in this case a P-type silicon substrate. As can be seen, control gate 304 is then formed within substrate 308, and is separated from substrate 308 by dielectric layer 306.

The dual control gates and associated trapping structures allow AC memory cell 300 to store 2-bits, one in each of trapping structures 308 and 310. As with the single-bit AC memory cell of FIG. 1, assisted charges 324 and 326 can be stored in nitride layers 314 and 320, respectively. The other side of nitride layers 314 and 320 can then act as data sides 332 and 334, respectively.

As described below, channel region 340 can be formed out of a silicon layer, such as an Epitaxial Lateral Overgrowth (ELO) silicon layer. A source 328 and a drain 330 can then be implanted in the silicon layer on opposite ends of channel region 340. Assisted charges 324 and 326 will form abrupt electrical field regions 336 and 338, respectively, in channel region 340. As with the device of FIG. 1, these abrupt electrical fields can help reduce the amount of programming current needed to program each bit of 2-bit AC memory device 300.

Figure 4:
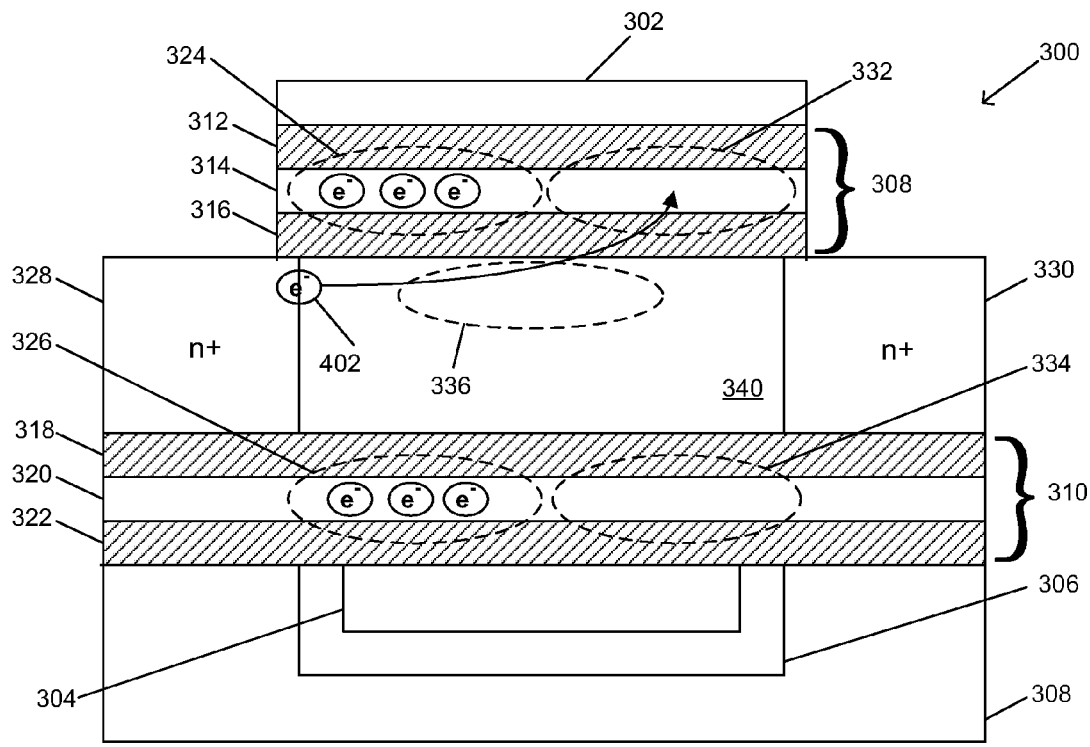
FIG. 4 is a diagram illustrating a method for programming the first bit of the 2-bit AC memory cell illustrated in FIG. 3.
Figure 5:
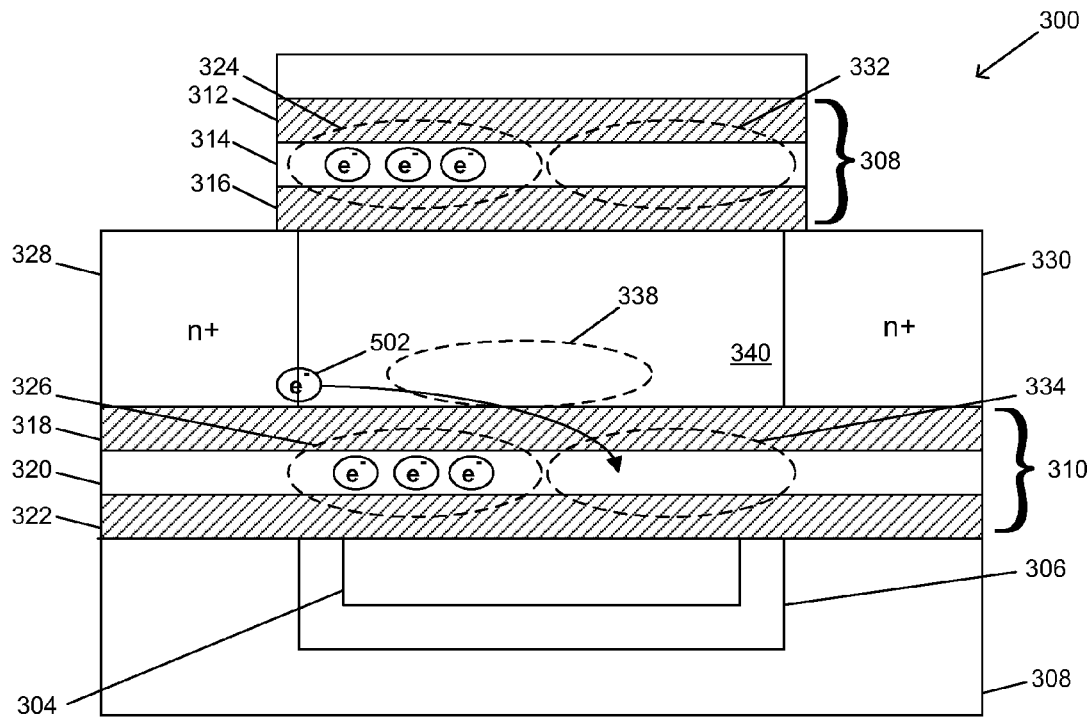
FIG. 5 is a diagram illustrating an example method for programming the second bit of the AC memory cell of FIG. 3.

FIGS. 4 and 5 are diagrams illustrating example methods for programming each bit of 2-bit AC memory cell 300. In FIG. 4, the first, or top bit of 2-bit AC memory cells 300 is being programmed via hot electrons 402. Hot electrons 402 are generated when the appropriate voltages are applied to control gates 302 and 304, source 328, and drain 330. As with the device of FIG. 1, when a high voltage is applied to drain 330 and a low voltage is applied to source 328, a strong lateral electric field is created that "pulls" electrons from source 328 into channel region 340 towards drain 334. The high voltage on control gate 302 can enhance some of these hot electrons 402 to penetrate oxide layer 316 and be trapped in nitride layer 314.

AC charges 324 repel these hot electrons 402 preventing them from tunneling into nitride layer 314 until they have passed abrupt electrical field 336. Once hot electrons 402 have passed abrupt electrical field 336, the high voltage on gate 302 will enhance some of these hot electrons 402 to tunnel through oxide layer 316 into data side 332 of nitride layer 314. A low voltage is applied to control gate 304. Thus, hot electrons 402 will not be induced to penetrate through oxide layer 318 of lower trapping structure 310 into nitride layer 320. In this manner, the programming of the first or second bit can be controlled in 2-bit AC memory device 300.

Conversely, the lower or second bit of 2-bit AC memory device 300 can be programmed by applying a high voltage to control gate 304 and drain 330, while applying a low voltage to source 328 and control gate 302. The voltage difference between drain 330 and source 328 will cause hot electrons 502 to flow through channel region 340 from source 328 to drain 330. AC charges 326 will repel hot electrons 502 until they have passed through abrupt electrical field 338. The high voltage on control gate 304 can then enhance some of hot electrons 502 to tunnel through oxide layer 318 into data side 334 of nitride layer 320.

In the example of FIG. 4, a voltage in the range of approximately 4-6 volts can be applied to control gate 302. More specifically, a gate voltage between 4.5-5.5 volts can be preferred. A voltage in the range of approximately 3-6 volts can be applied to drain 330. More specifically, a drain voltage of approximately 4-5.5 volts can be preferred. Source 328 and control gate 304 can be tied to a low voltage of approximately 0 volts.

Similarly, in the example of FIG. 5, a voltage in the range of approximately 4-6 volts can be applied to control gate 304. More specifically, a gate voltage between 4.5-5.5 volts can be preferred. A voltage in the range of approximately 3-6 volts can be applied to drain 330. More specifically, a drain voltage of approximately 4-5.5 volts can be preferred. Source 328 and control gate 302 can be tied to a low voltage of approximately 0 volts.

It will be understood, however, that the voltages illustrated in FIGS. 4 and 5 are by way of example only and that the particular voltages used will depend on the requirements of a specific implementation.

Each data bit of 2-bit memory cell 300 can be erased by applying a high voltage to drain 330 and a low voltage to source 326 while applying a large negative voltage to the control gate associated with the bit being erased. The other control gate can be tied to a low voltage, such as 0 volts. Thus, in FIG. 6, a large negative voltage is applied to control gate 302 in order to erase data side 332 of trapping structure 308. The large negative voltage on control gate 302 will induce holes 602 to tunnel through oxide layer 316 into nitride layer 314, where they will compensate for the electrons trapped in data side 332.

Figure 7:
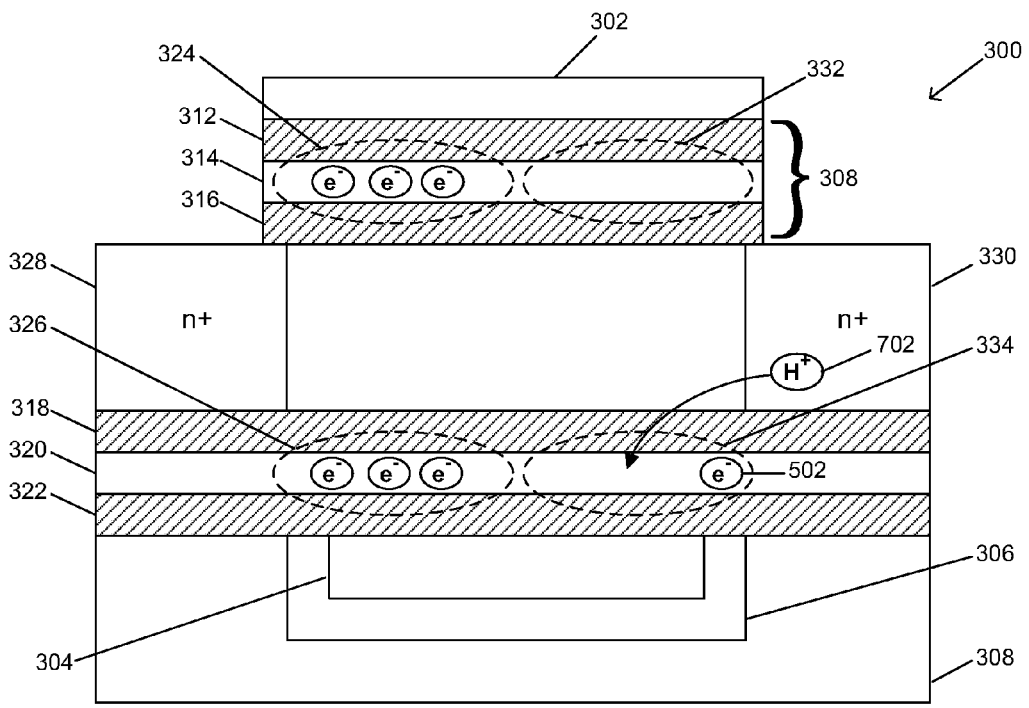
FIG. 7 is a diagram illustrating a method for erasing the second bit of the 2-bit AC memory cell of FIG. 3.

Similarly, as illustrated in FIG. 7, applying a large negative voltage to control gate 304 will cause holes 702 to tunnel through oxide layer 318 into data side 334, where holes 702 will compensate for electrons previously trapped in data side 334.

Figure 6:
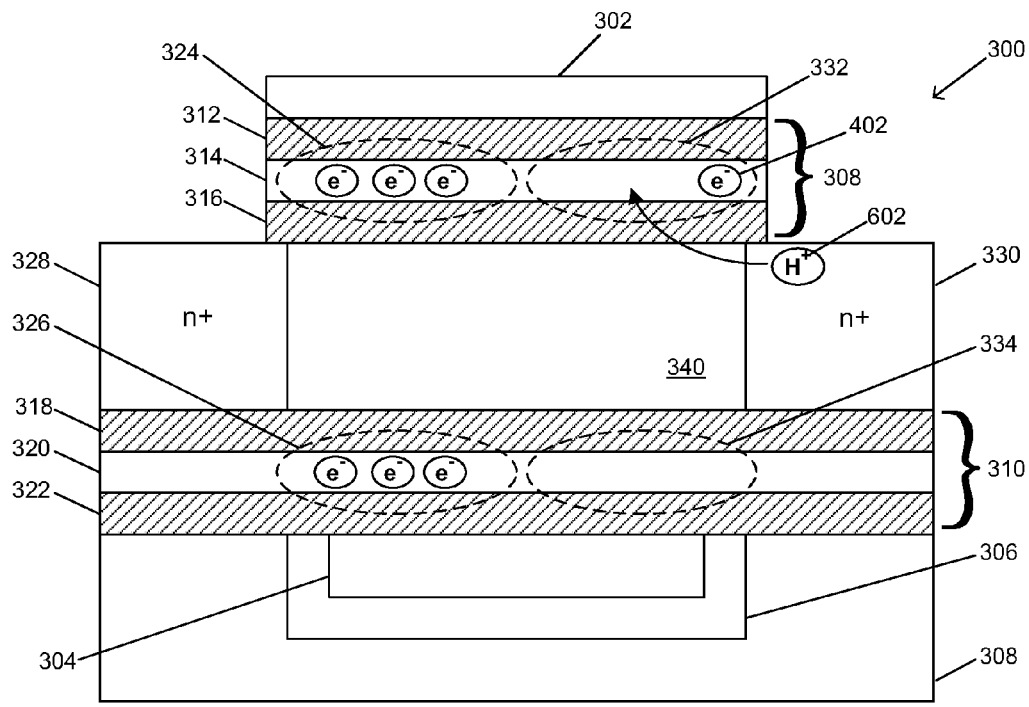
FIG. 6 is a diagram illustrating an example method for erasing the first bit of the 2-bit AC memory cell in FIG. 3.

In the example of FIG. 6, a voltage in the range of approximately −7−−10 volts can be applied to control gate 302. More specifically, a gate voltage between −8−−9 volts can be preferred. A voltage in the range of approximately 4-6 volts can be applied to drain 330. More specifically, a drain voltage of approximately 4.5-5.5 volts can be preferred. Source 328 and control gate 304 can be tied to a low voltage of approximately 0 volts.

Similarly, in the example of FIG. 7, a voltage in the range of approximately −7−−10 volts can be applied to control gate 304. More specifically, a gate voltage between −8−−9 volts can be preferred. A voltage in the range of approximately 4-6 volts can be applied to drain 330. More specifically, a drain voltage of approximately 4.5-5.5 volts can be preferred. Source 328 and control gate 302 can be tied to a low voltage of approximately 0 volts.

It will be understood, however, that the voltages illustrated in FIG. 6 and FIG. 7 are by way of example only and that the voltages used will depend on the requirements of a specific implementation.

Figure 8:
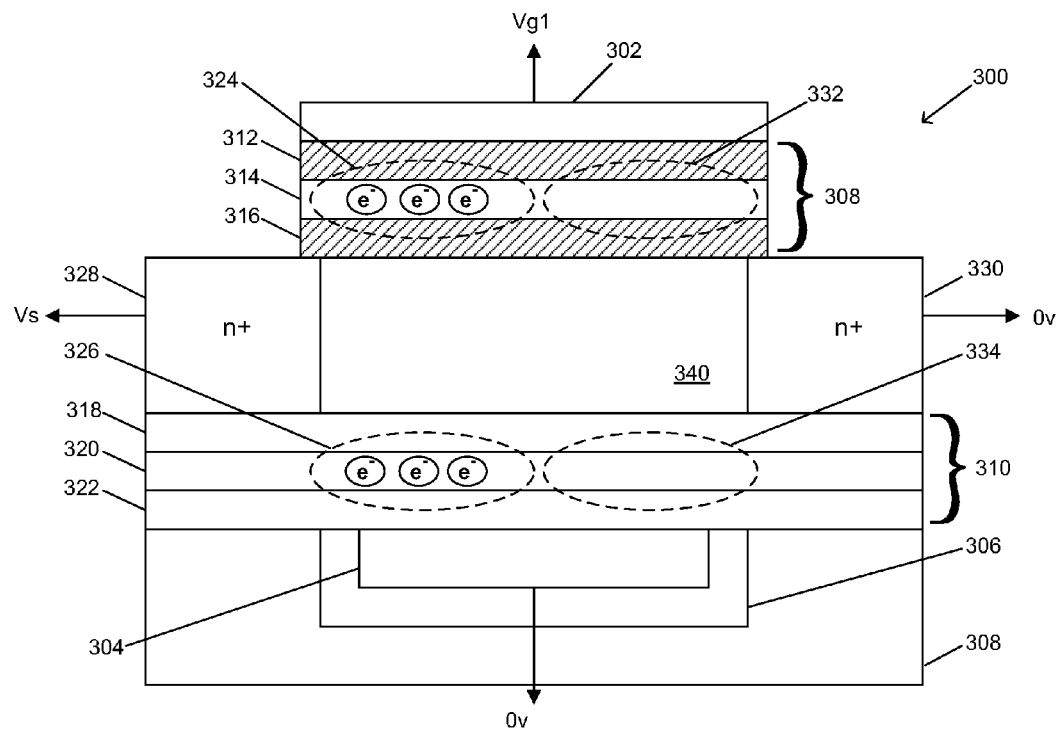
FIG. 8 is a diagram illustrating an example method for reading a first bit of the 2-bit AC memory cell of FIG. 3.

Trapping hot electrons in data side 332 and/or 334 changes the threshold voltage associated with the associated bit. By applying the correct read voltages to control gates 302 and 304, source 328, and drain 330, this change in threshold voltage can be detected in order to determine the program state of data sides 332 and 334. Accordingly, FIG. 8 illustrates that by applying a high voltage to control gate 302 and source 328, while applying a low voltage to drain 330 and control gate 306, the program status of data side 332 can be determined. Similarly, FIG. 9 illustrates that by applying a high voltage to control gate 304 and source 328, while applying a low voltage to drain 330 and control gate 302, the program status of data side 334 can be determined.

In the examples of FIG. 8, a voltage in the range of approximately 2-4 volts can be applied to control gate 302. More specifically, a gate voltage between 2.5-3.5 volts can be preferred. A voltage in the range of approximately 1-2 volts can be applied to source 328. More specifically, a source voltage of approximately 1.4-1.8 volts can be preferred. Drain 330 and control gate 304 can be tied to a low voltage of approximately 0 volts.

Figure 9:
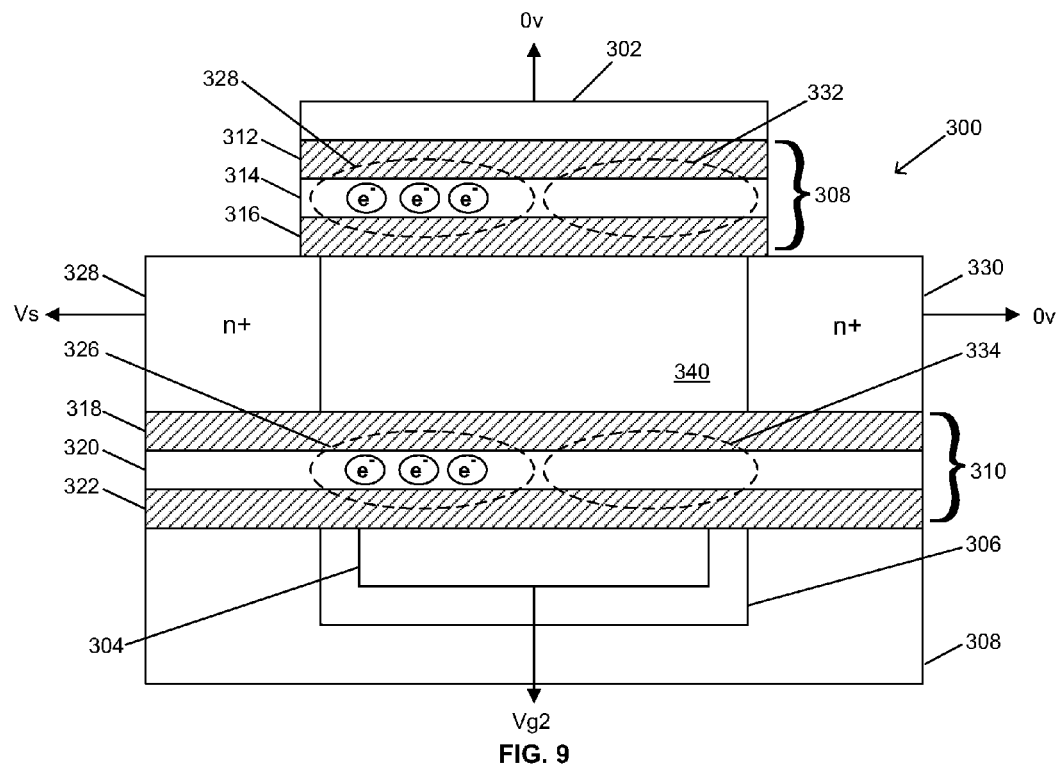
FIG. 9 is a diagram illustrating an example method for reading the second bit of the 2-bit AC memory cell of FIG. 3.

Similarly, in the example of FIG. 9, a voltage in the range of approximately 2-4 volts can be applied to control gate 304. More specifically, a gate voltage between 2.5-3.5 volts can be preferred. A voltage in the range of approximately 1-2 volts can be applied to source 328. More specifically, a source voltage of approximately 1.4-1.8 volts can be preferred. Drain 330 and control gate 302 can be tied to a low voltage of approximately 0 volts.

It will be understood, however, that voltages illustrated in FIGS. 8 and 9 are by way of example only and that the actual voltages used will depend on the requirements of a specific implementation.

Figure 10:
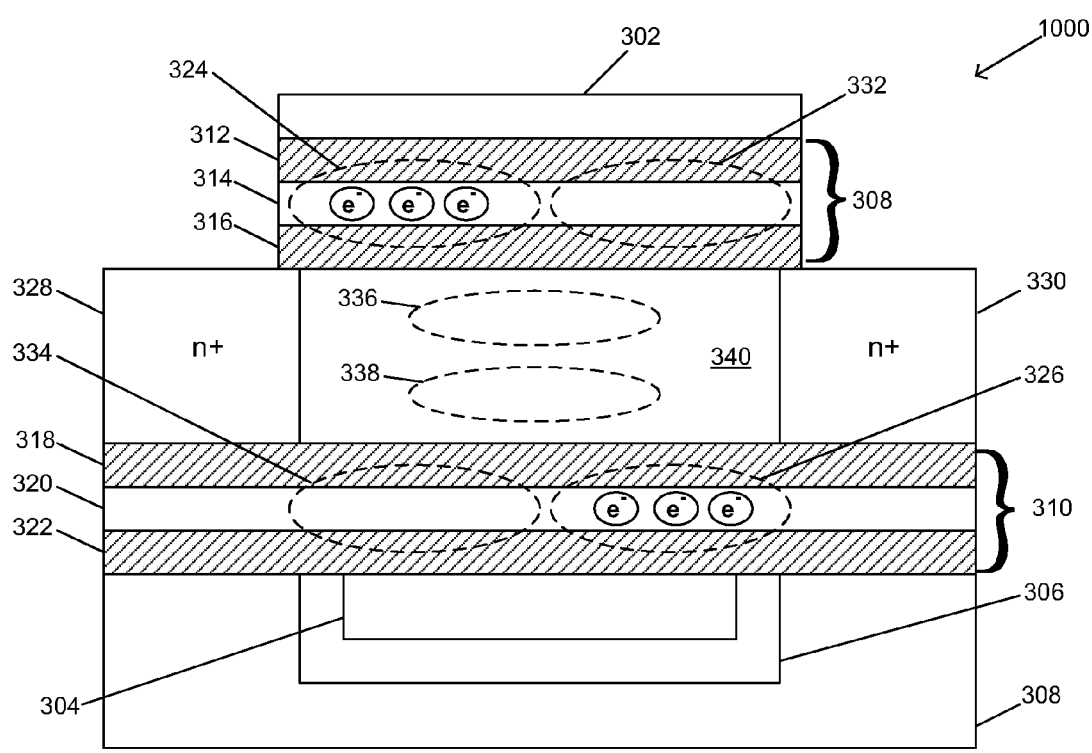
FIG. 10 is a diagram illustrating another example embodiment of a 2-bit AC memory cell.
Figure 11:
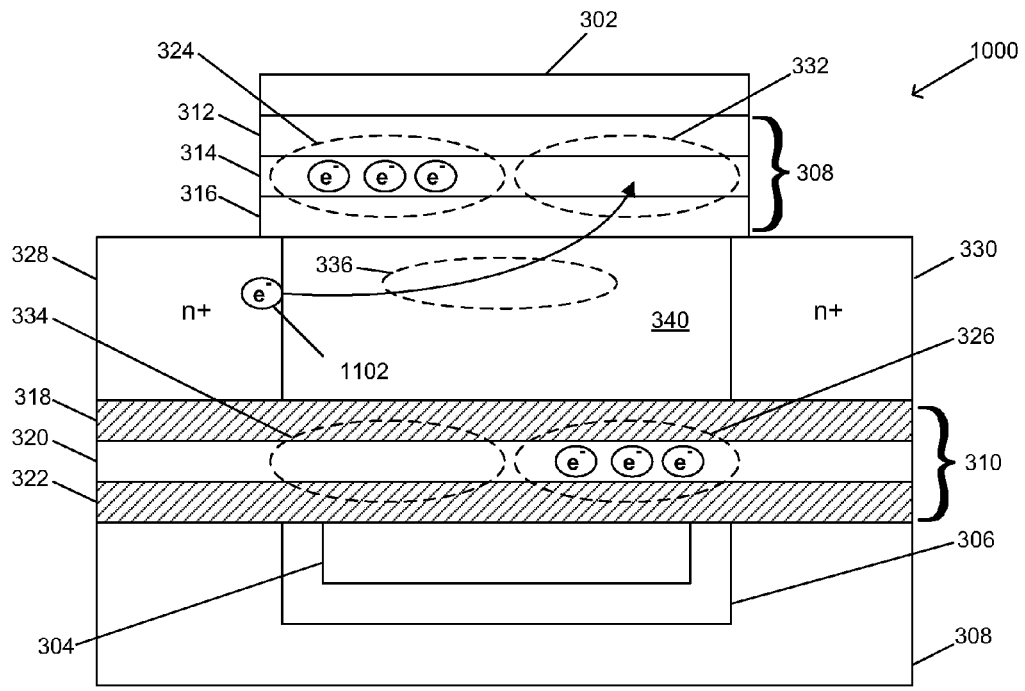
FIG. 11 is a diagram illustrating an example method for programming the first bit of the 2-bit AC memory cell of FIG. 10.

FIG. 10 is a diagram illustrating an example 2-bit AC memory device 1000 configured in accordance with another embodiment. In 2-bit AC memory device 1000, AC and data sides 326 and 334, respectively, are reversed in trapping layer 310. Accordingly, as illustrated in FIG. 11, data side 332 can be programmed in the same manner as with respect to 2-bit AC memory device 300. In other words, a high voltage can be applied to control gate 302 and drain 330, while a low voltage is applied to source 328. This will induce hot electrons 1102 to flow from source 328 into channel region 340. The high voltage on control gate 302 will enhance some hot electrons 1102 to tunnel through oxide layer 316 into data side 332 of nitride layer 314. A low voltage is applied to control gate 304 in order to prevent hot electrons 1102 from tunneling through oxide layer 318 into data side 334 of nitride layer 320.

Figure 12:
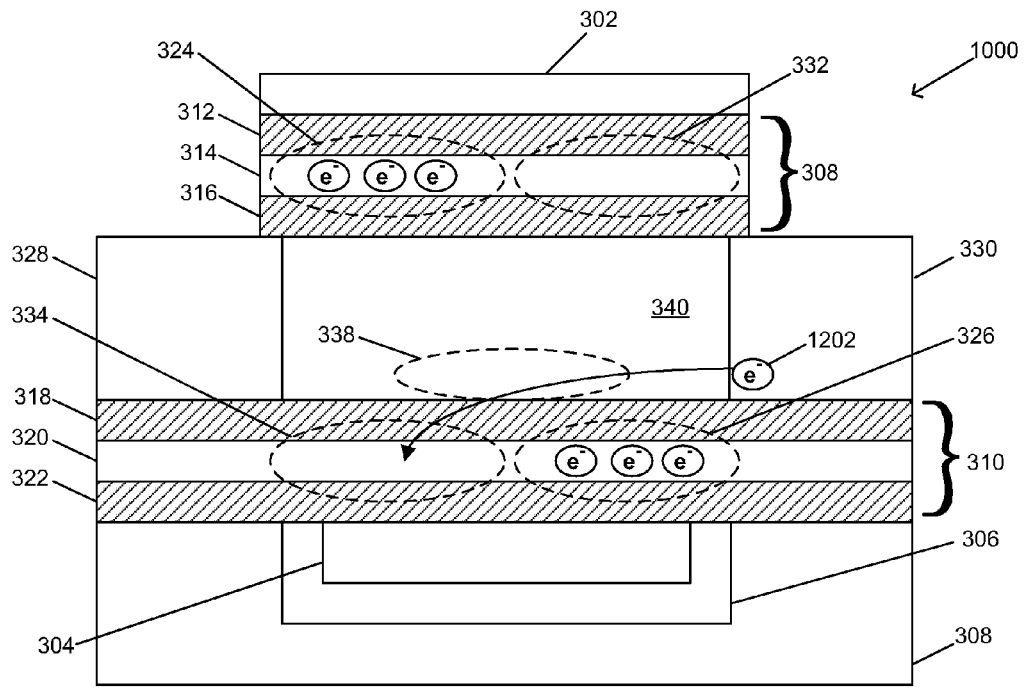
FIG. 12 is a diagram illustrating an example method for programming the second bit of the 2-bit AC memory cell of FIG. 10.

Data side 334 can be programmed, as illustrated in FIG. 12, by applying a high voltage to gate 304 and source 328, while applying a low voltage to drain 330. This will cause hot electrons to flow from drain 330 towards source 328 through channel region 340. The high voltage on control gate 304 will enhance some hot electrons 1202 to tunnel through oxide layer 318 into data side 334 of nitride layer 320. The low voltage on control gate 302 will prevent hot electrons 1202 from tunneling through oxide layer 316 into data side 332 and nitride layer 314.

In FIG. 11, a voltage in the range of approximately 4-6 volts can be applied to control gate 302. More specifically, a gate voltage between 4.5-5.5 volts can be preferred. A voltage in the range of approximately 3-6 volts can be applied to drain 330. More specifically, a drain voltage of approximately 4-5.5 volts can be preferred. Source 328 and control gate 304 can be tied to a low voltage of approximately 0 volts.

Similarly, in FIG. 12, a voltage in the range of approximately 4-6 volts can be applied to control gate 304. More specifically, a gate voltage between 4.5-5.5 volts can be preferred. A voltage in the range of approximately 3-6 volts can be applied to source 328. More specifically, a source voltage of approximately 4-5.5 volts can be preferred. Drain 330 and control gate 302 can be tied to a low voltage of approximately 0 volts.

It will be understood, however, that the voltages illustrated in FIGS. 11 and 12 are by way of example only in that the actual voltages used will depend on the requirements of a specific implementation.

Figure 13:
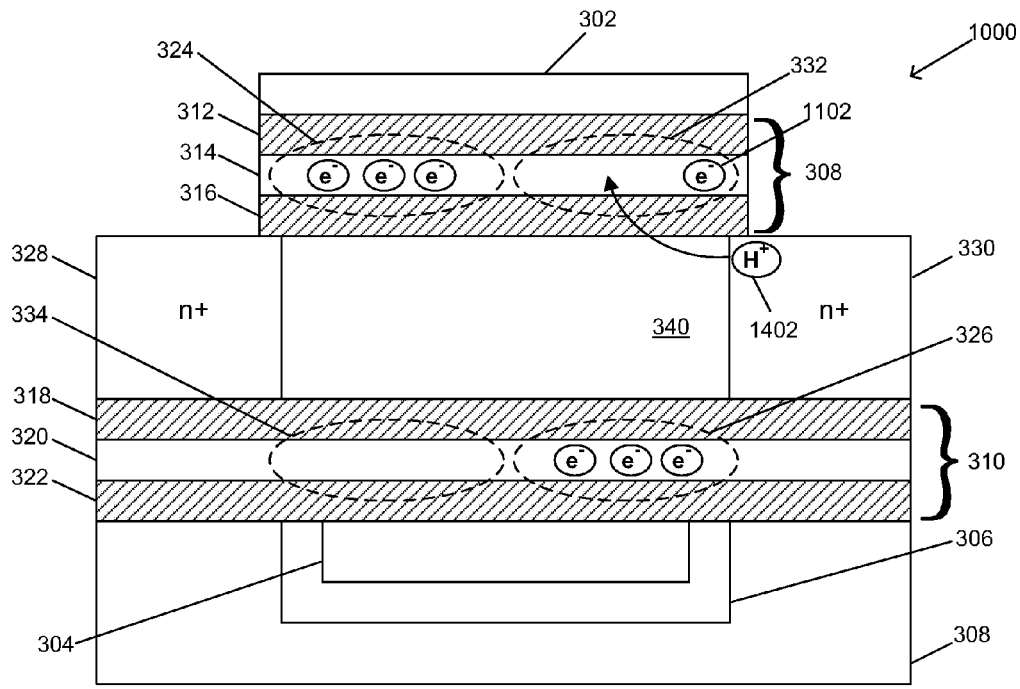
FIG. 13 is a diagram illustrating an example method for erasing the first bit of the 2-bit AC memory cell of FIG. 10.

FIG. 13 is a diagram illustrating an example method for erasing data side 332 in accordance with one embodiment. As with 2-bit AC memory device 300, data side 332 of device 1000 can be erased by applying a large negative voltage to control gate 302, a high voltage to drain 330, and a low voltage to source 328 and control gate 304. The large negative voltage on control gate 302 will enhance holes 1402 from drain 330, allowing holes 1402 to tunnel through oxide layer 316 into data side 332 of nitride layer 314. Holes 1402 will compensate for any electrons 1102 trapped in data side 332. The low voltage on control gate 304 will prevent holes 1402 from tunneling through oxide layer 318 into data side 334 of nitride layer 320.

Figure 14:
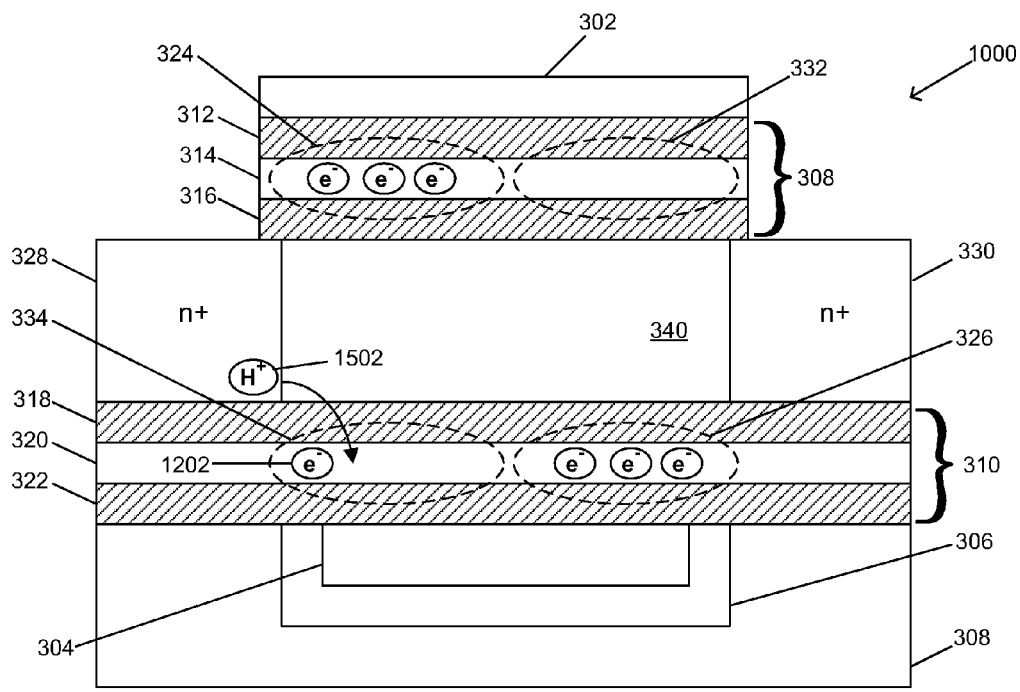
FIG. 14 is a diagram illustrating an example method for erasing the second bit of the 2-bit AC memory cell of FIG. 10.

FIG. 14 is a diagram illustrating an example method for erasing data side 334 in accordance with one embodiment. A large negative voltage is applied to control gate 304, a high voltage is applied to source 328, and a low voltage is applied to drain 330 and control gate 302. The large negative voltage on control gate 304 will enhance holes 1502 from source 328, allowing them to tunnel through oxide layer 318 into data side 334 of nitride layer 320 where they will compensate for electrons 1202 stored in data side 334. The low voltage on control gate 302 will prevent holes 1502 from tunneling through oxide layer 316 into data side 332.

In the examples of FIG. 13, a voltage in the range of approximately −7−−10 volts can be applied to control gate 302. More specifically, a gate voltage between −8−−9 volts can be preferred. A voltage in the range of approximately 4-6 volts can be applied to drain 330. More specifically, a drain voltage of approximately 4.5-5.5 volts can be preferred. Source 328 and control gate 304 can be tied to a low voltage of approximately 0 volts.

In the example of FIG. 14, a voltage in the range of approximately −7−−10 volts can be applied to control gate 304. More specifically, a gate voltage between −8−−9 volts can be preferred. A voltage in the range of approximately 4-6 volts can be applied to source 328. More specifically, a source voltage of approximately 4.5-5.5 volts can be preferred. Drain 330 and control gate 302 can be tied to a low voltage of approximately 0 volts.

It will be understood, however, that these voltages are by way of example only and the actual voltage is used will depend on the requirements of the specific embodiment.

Figure 15:
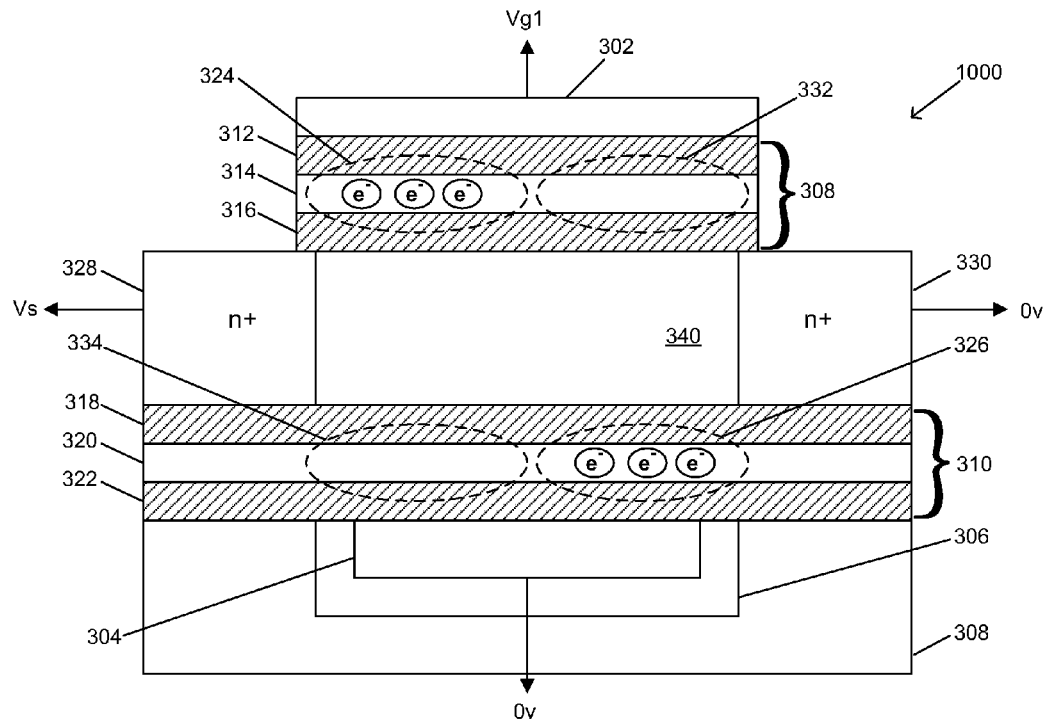
FIG. 15 is a diagram illustrating an example method for reading the first bit of the 2-bit AC memory cell of FIG. 10.
Figure 16:
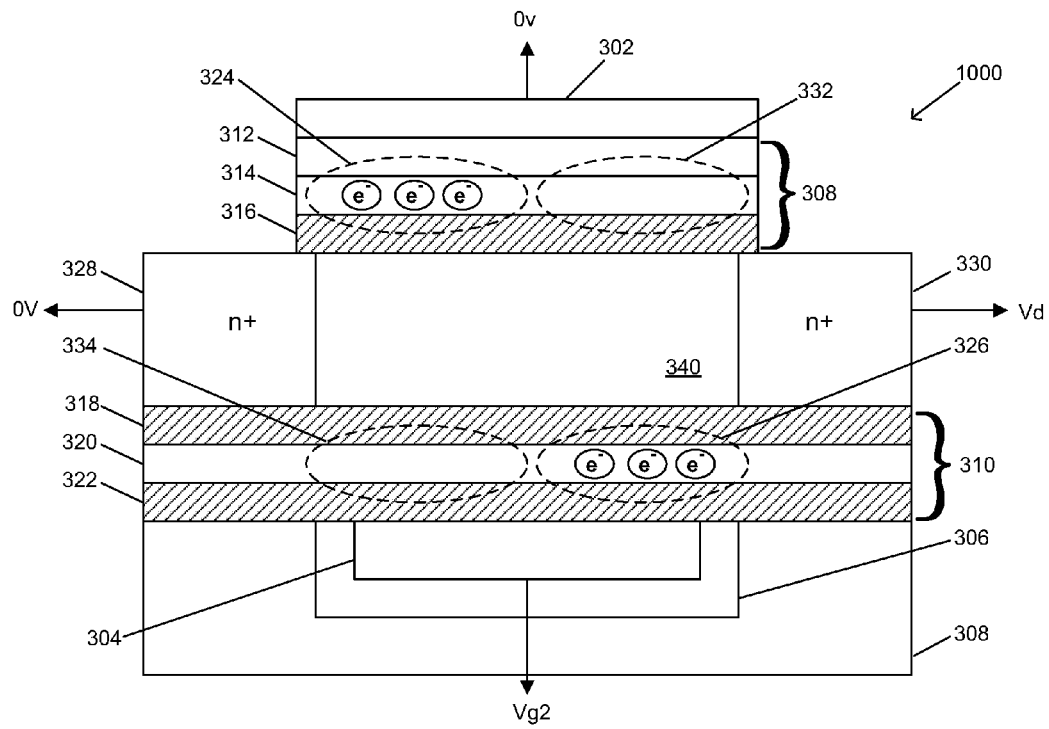
FIG. 16 is a diagram illustrating an example method for reading the second bit of the 2-bit AC memory cell of FIG. 10.

FIG. 15 is a diagram illustrating an example method for reading data side 332 of 2-bit AC memory device 1000 in accordance with one embodiment. In order to read data side 332, a high voltage can be applied to control gate 302 and source 328, while a low voltage is applied to drain 330 and control gate 304. Similarly. FIG. 16 is a diagram illustrating an example method for reading data side 334 of 2-bit AC memory device 1000 in accordance with one embodiment. Here, a high voltage is applied to control gate 304 and to drain 330, while low voltage is applied to source 328 and control gate 302.

In the example embodiment of FIG. 15, a voltage in the range of approximately 2-4 volts can be applied to control gate 302. More specifically, a gate voltage between 2.5-3.5 volts can be preferred. A voltage in the range of approximately 1-2 volts can be applied to source 328. More specifically, a source voltage of approximately 1.4-1.8 volts can be preferred. Drain 330 and control gate 304 can be tied to a low voltage of approximately 0 volts.

In the example of FIG. 16, a voltage in the range of approximately 2-4 volts can be applied to control gate 304. More specifically, a gate voltage between 2.5-3.5 volts can be preferred. A voltage in the range of approximately 1-2 volts can be applied to drain 330. More specifically, a drain voltage of approximately 1.4-1.8 volts can be preferred. Source 328 and control gate 302 can be tied to a low voltage of approximately 0

It will be understood, however, that the voltages illustrated in FIGS. 15 and 16 by way of example only and that the actual voltages used depend on the requirement of a specific embodiment.

Figure 17A:
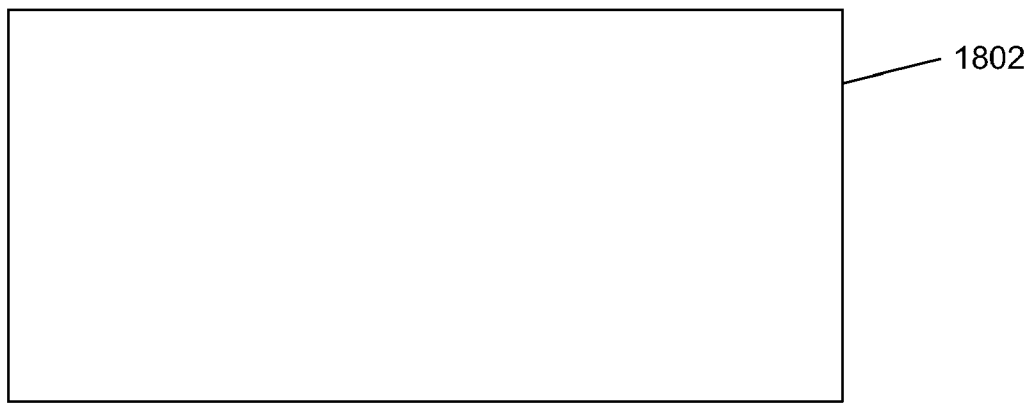
FIGS. 17A through 17O illustrate one example method for fabricating a 2-bit AC memory cell, such as the 2-bit AC memory cells illustrated in the FIGS. 3 and 10, in accordance with one embodiment.
Figure 17B:
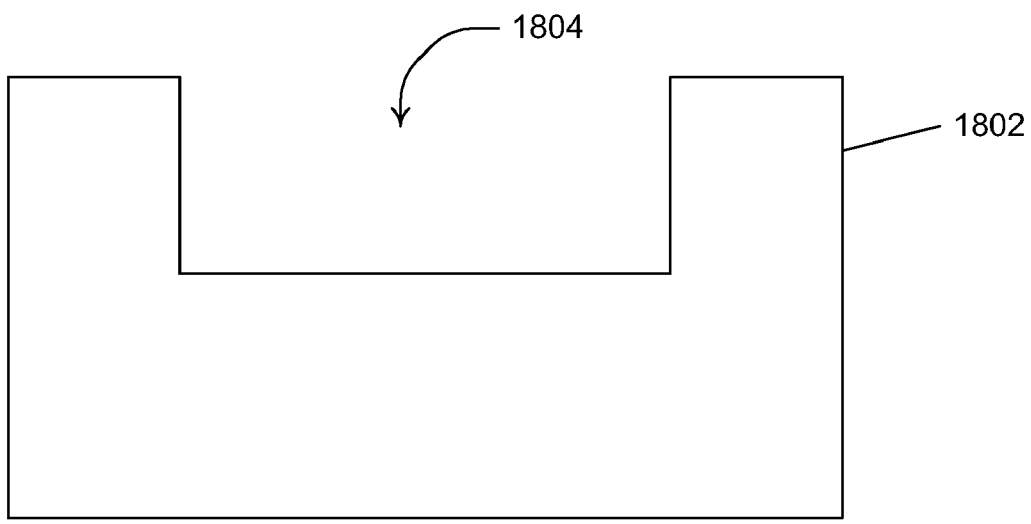
Figure 17C:
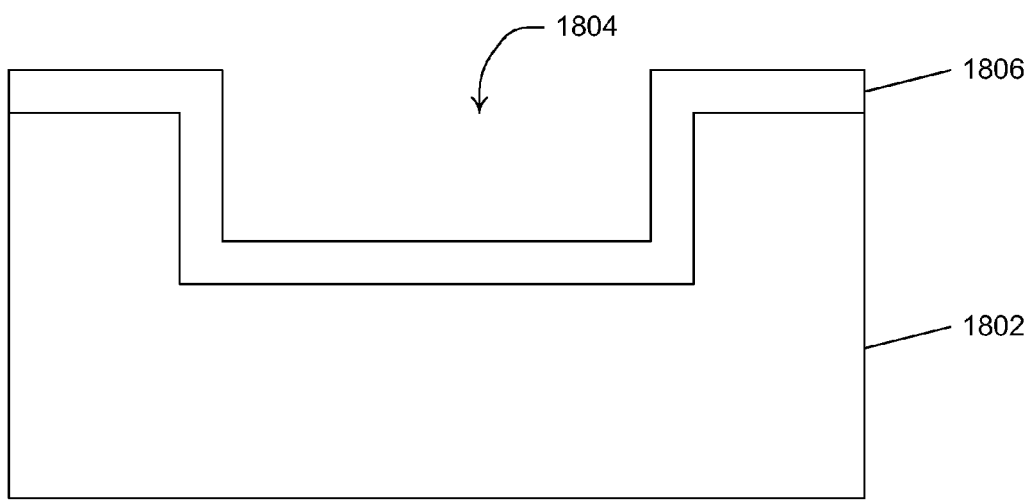
Figure 17D:
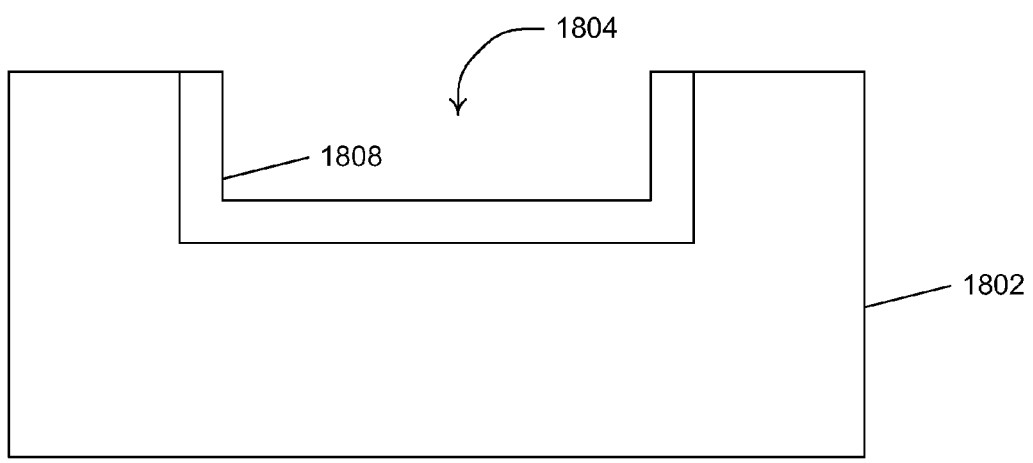
Figure 17E:
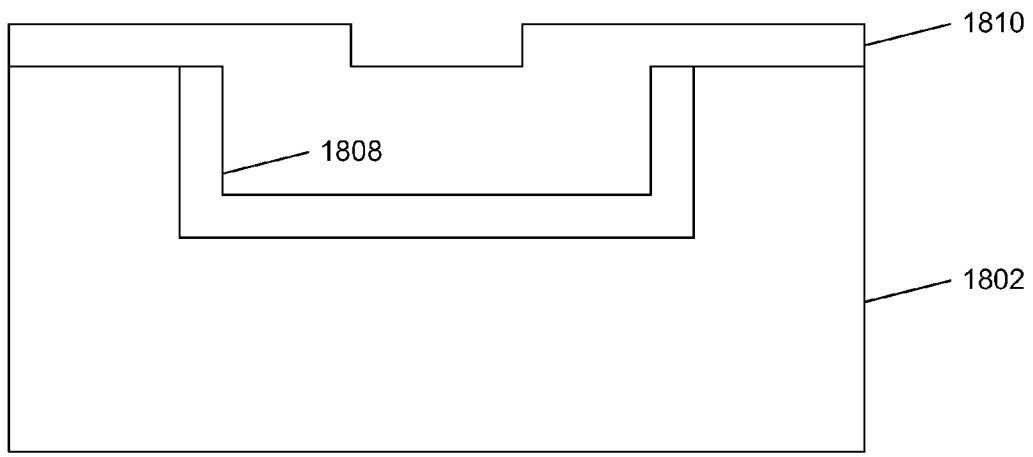
Figure 17F:
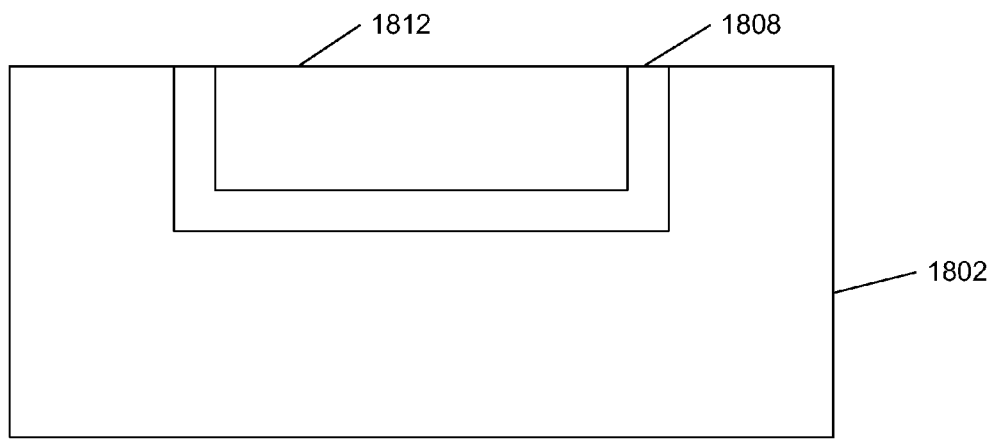
Figure 17G:
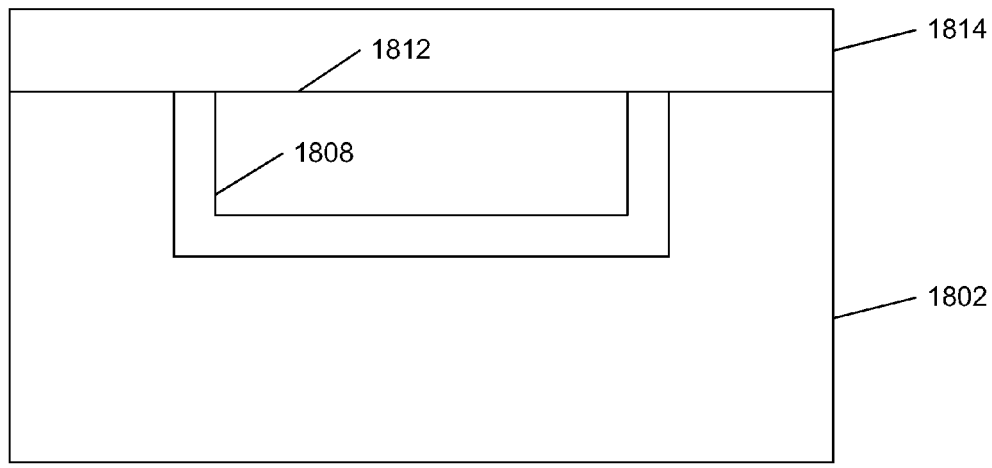
Figure 17H:
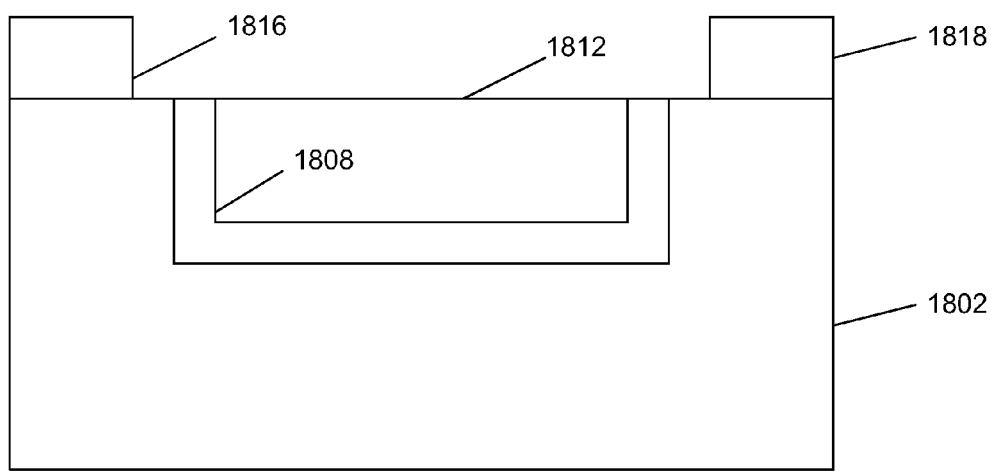
Figure 17I:
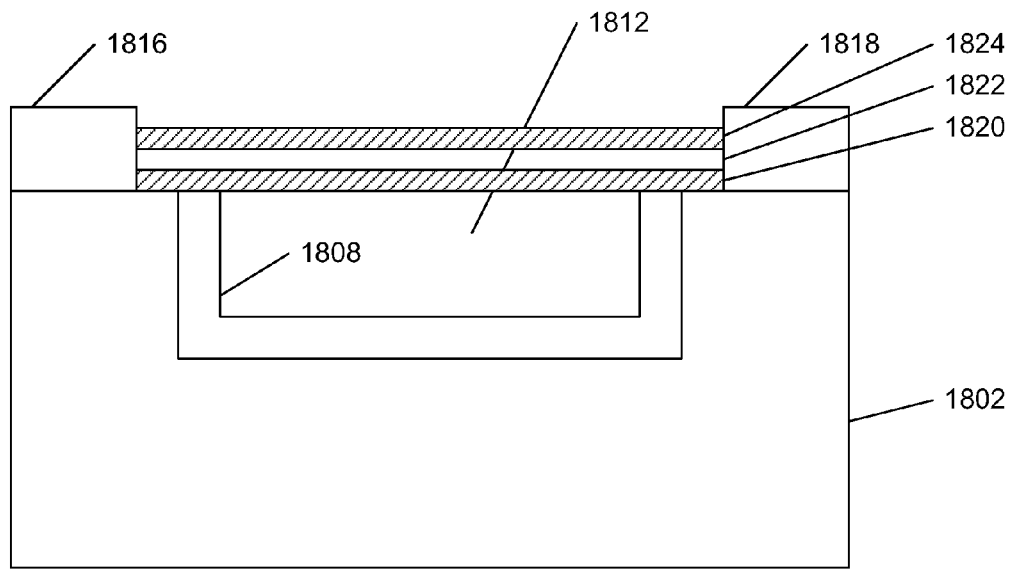
Figure 17J:
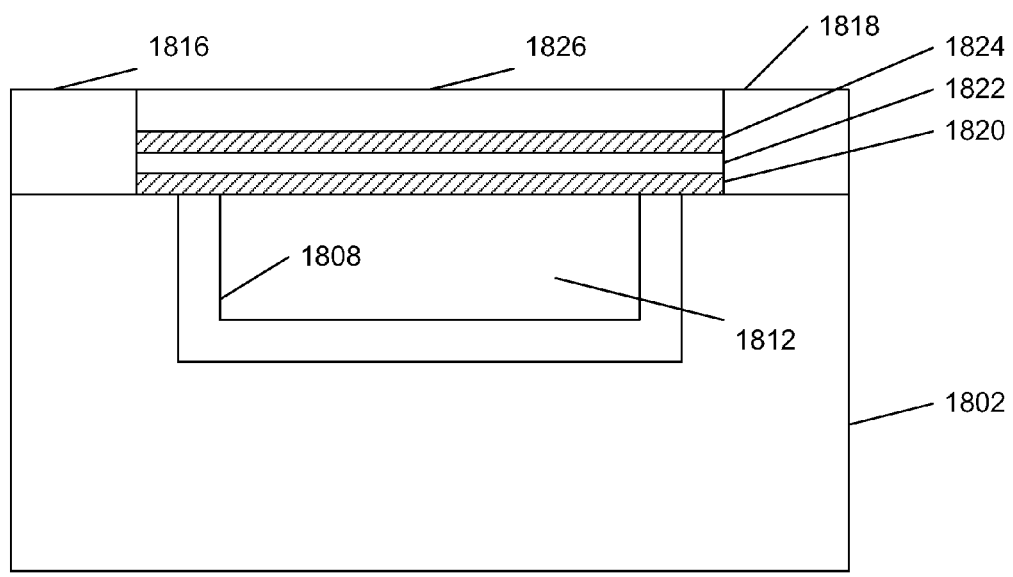
Figure 17K:
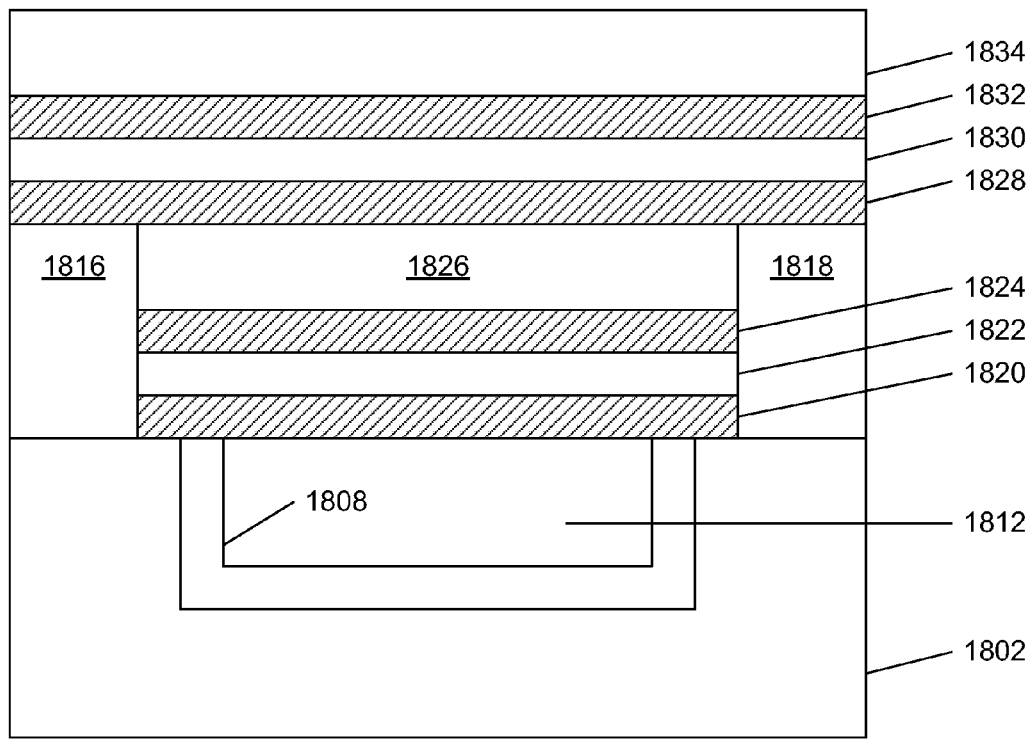
Figure 17L:
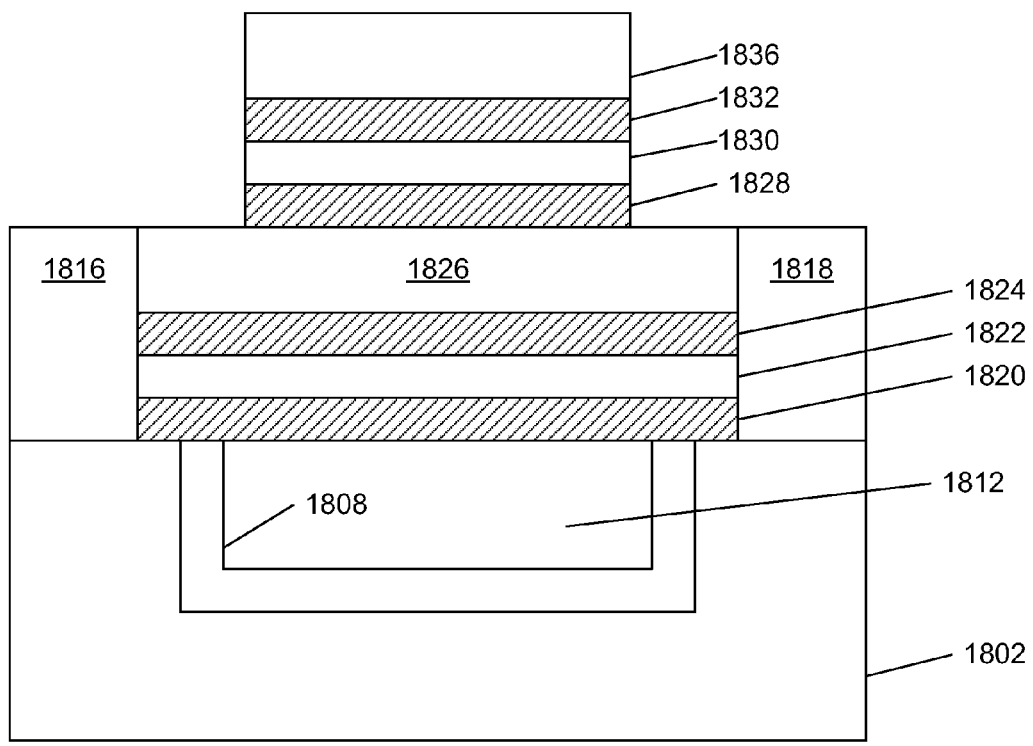
Figure 17M:
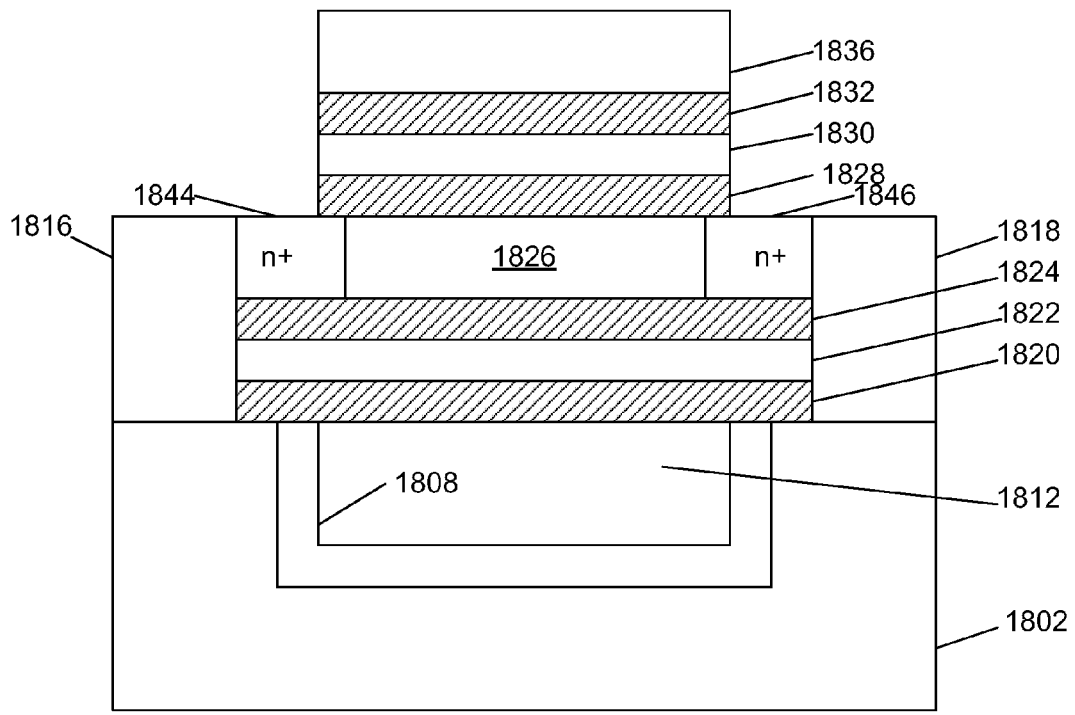
Figure 17N:
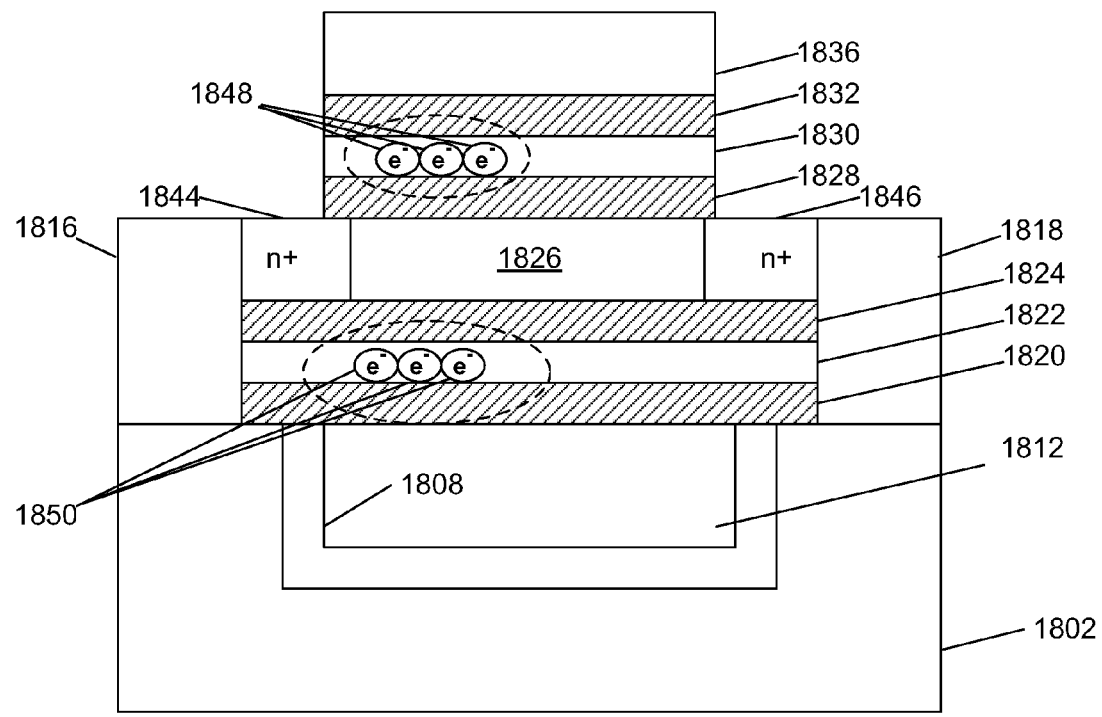
Figure 17O:
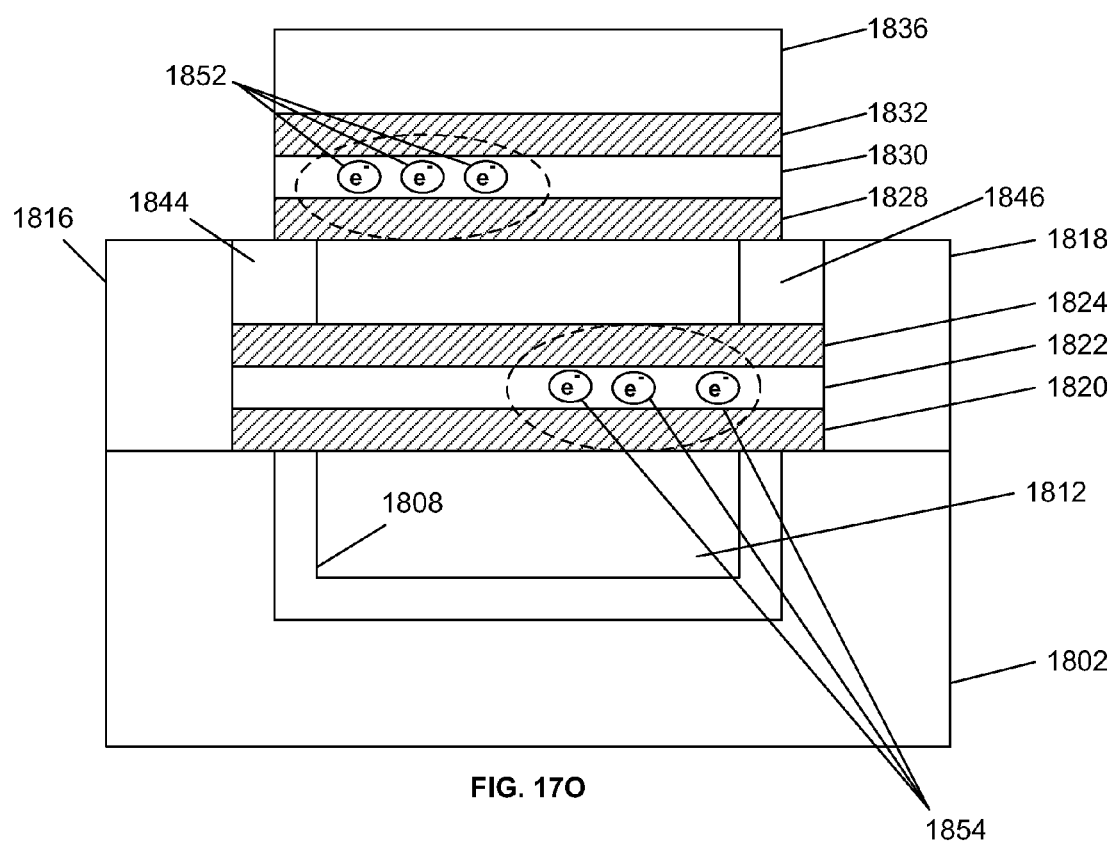

FIGS. 17A through 17O are diagrams illustrating an example process for fabricating a 2-bit AC memory device, such as memory devices 300 or 1000 illustrated FIGS. 3 and 10 respectively. First, as illustrated in FIG. 17A, a substrate 1802 can be formed. For example, substrate 1802 can be a P-type silicon substrate. As illustrated in FIG. 17B, a trench 1804 can then be etched in substrate 1802 using conventional photolithography techniques.

As illustrated in FIG. 17C, an oxide layer 1806 can then be formed over substrate 1802. As illustrated in FIG. 17D, the portions of oxide layer 1806 extending above substrate 1802 can then be polished away, for example using an oxide CMP process, such that only portion 1808 of oxide layer 1806 within trench 1804 remains. CMP processes are well known and will not be described in detail here.

As illustrated in FIG. 17E, a poly-silicon layer 1810 can then be formed over substrate 1802 and oxide layer 1808. As illustrated in FIG. 17F, the portions of poly-silicon layer 1810 extending above substrate 1802 can be polished away leaving portion 1812 within trench 1804. For example, a poly-silicon CMP process can be used to polish away poly-silicon layer 1810 extending above substrate 1802. Again, poly-silicon CMP processes are well known and will not be described in detail here.

As illustrated in FIG. 17G, an oxide layer 1814 can then be formed over substrate 1802. Oxide layer 1814 can then be etched using a conventional photolithography technique as illustrated in FIG. 17H leaving oxide regions 1816 and 1818.

As illustrated in FIG. 17I, after the etching process of FIG. 17H, an ONO structure can be formed over trench 1804 by the depositing oxide layer 1820, nitride layer 1822, and oxide layer 1824.

Next, as illustrated in FIG. 17J, a silicon layer 1826 can be formed over the ONO structure. For example, in one embodiment an ELO silicon layer can be formed over the ONO structure. As illustrated in FIG. 17K, a second ONO structure comprising oxide layer 1828, nitride layer 1830, and oxide layer 1832 can be formed over silicon layer 1826, and a poly-silicon layer 1834 can be formed thereon. The second ONO structure and poly-silicon layer 1834 can then be etched using conventional photolithography techniques as illustrated in FIG. 17L leaving behind poly-silicon region 1836.

Poly regions 1812 and 1836 can then act as the control gates associated with each data bit of the 2-bit AC memory device being formed. ELO silicon layer 1826 can then act as the channel region. Drain and source regions can be implanted in ELO silicon layer 1826 as illustrated in FIG. 17M. As can be seen in FIG. 17M, N+ regions 1844 and 1846 are implanted in ELO silicon layer 1826.

Assisted charges can then be trapped in the ONO structures formed in the process described above. Depending on the embodiment, the assisted charges can be trapped on the same side of the ONO structures, or on opposite sides. Thus, as illustrated in FIG. 17N, assisted charges 1848 and 1850 can be trapped on the same side of two ONO layers. Alternatively, as illustrated in FIG. 17O, assisted charges 1852 and 1854 can be trapped on opposite sides of the ONO structures.

Depending on the embodiment, the nitride layer include in the ONO structures described in the process above can, e.g., be a silicon nitride layer. In other embodiments, however, the nitride layer can be replaced by another localized charged material, such as a nanocrystal. Further, while the devices described above are configured to store a single bit on each side of the device, multi-level cell (MLC) devices can also be constructed in accordance with the methods and apparatus described herein in order to achieve n-bit AC memory devices.

While certain embodiments of the inventions have been described above, it will be understood that the embodiments described are by way of example only. For example, while p-type substrates and n-type drain and source regions are shown, it will be understood that other embodiments may use n-type substrates with p-type drain and source regions. Further, non-volatile memory devices configured in accordance with the systems and methods described herein can be single well or multiple well devices depending on the embodiment. Accordingly, the inventions should not be limited based on the described embodiments. Rather, the scope of the inventions described herein should only be limited in light of the claims that follow when taken in conjunction with the above description and accompanying drawings.

What is claimed is:

1. A non-volatile memory device, comprising:
   a channel region;
   a drain on one end of the channel region;
   a source on the other end of the channel region;
   a first trapping structure above the channel region, the first trapping structure comprising an AC side configured to constantly store an assisted charge during operation of the device that causes an abrupt electric field in the channel region;
   a first control gate formed over the first trapping structure;
   a second trapping structure below the channel region, the second trapping structure comprising an AC side configured to constantly store an assisted charge during operation of the device that causes an abrupt electric field in the channel region; and
   a second control gate formed below the second trapping structure,
   wherein each of the first and second trapping structures further comprises a data side configured to store first and second bits of information, respectively, while the AC sides of the first and second trapping structures store their assisted charges,
   wherein the AC side and the data side have a first threshold value and a second threshold value, respectively, and
   wherein the second threshold value of the data side is varied corresponding to stored data, and the first threshold value of the AC side is a near-fixed value.

2. The non-volatile memory device of claim 1, further comprising a substrate, wherein the second control gate is formed in the substrate, and wherein the channel region, source, drain, first and second trapping structures, and first control gate are all formed over the substrate.

3. The non-volatile memory device of claim 1, wherein the AC sides of the first and second trapping structures are on the same side of the first and second trapping structures.

4. The non-volatile memory device of claim 1, wherein the AC sides of the first and second trapping structures are on opposite sides of the first and second trapping structures.

5. The non-volatile memory device of claim 1, wherein the data sides of the first and second trapping structures are on the same side of the first and second trapping structures.

6. The non-volatile memory device of claim 1, wherein the data sides of the first and second trapping structures are on opposite sides of the first and second trapping structures.

7. The non-volatile memory device of claim 1, wherein the first trapping structure comprises an ONO structure.

8. The non-volatile memory device of claim 1, wherein the second trapping structure comprises an ONO structure.

9. The non-volatile memory device of claim 1, wherein the first trapping structure comprises a localized charge material.

10. The non-volatile memory device of claim 9, wherein the localized charged material is a nanocrystal.

11. The non-volatile memory device of claim 1, wherein the second trapping structure comprises a localized charge material.

12. The non-volatile memory device of claim 11, wherein the localized charged material is a nanocrystal.

13. The non-volatile memory device of claim 1, wherein the first bit can be programmed by creating a large lateral electric field in the channel region between the source and drain, applying a high voltage to the first control gate, and applying a low voltage to the second control gate.

14. The non-volatile memory device of claim 1, wherein the second bit can be programmed by creating a large lateral electric field in the channel region between the source and drain, applying a high voltage to the second control gate, and applying a low voltage to the first control gate.

15. The non-volatile memory device of claim 1, wherein the first bit can be erased by band to band hot hole injection, applying a large negative voltage to the first control gate, and applying a low voltage to the second control gate.

16. The non-volatile memory device of claim 1, wherein the second bit can be erased by band to band hot hole injection, applying a large negative voltage to the second control gate, and applying a low voltage to the first control gate.

17. A non-volatile memory device, comprising:
a channel region;
a drain on one end of the channel region;
a source on the other end of the channel region;
a first trapping structure above the channel region, the first trapping structure comprising an AC side configured to constantly store an assisted charge during operation of the device that causes an abrupt electric field in the channel region, and further comprising a data side configured to store a first bit of information while the AC side of the first trapping structure stores its assisted charge;
a first control gate formed over the first trapping structure;
a second trapping structure below the channel region, the second trapping structure comprising an AC side configured to constantly store an assisted charge during operation of the device that causes an abrupt electric field in the channel region, and further comprising a data side configured to store a second bit of information while the AC side of the second trapping structure stores its assisted charge, the AC side of the second trapping structure on the same side of the device as the AC side of the first trapping structure; and
a second control gate formed below the second trapping structure,
wherein the AC sides have a first threshold value and the data sides have a second threshold value, and
wherein the second threshold value of the data sides is varied corresponding to stored data and the first threshold value of the AC sides is a near-fixed value.

18. The non-volatile memory device of claim 17, further comprising a substrate, wherein the second control gate is formed in the substrate, and wherein the channel region, source, drain, first and second trapping structures, and first control gate are all formed over the substrate.

19. The non-volatile memory device of claim 17, wherein the first trapping structure comprises an ONO structure.

20. The non-volatile memory device of claim 17, wherein the second trapping structure comprises an ONO structure.

21. The non-volatile memory device of claim 17, wherein the first bit can be programmed by creating a large lateral electric field in the channel region between the source and drain, applying a high voltage to the first control gate, and applying a low voltage to the second control gate.

22. The non-volatile memory device of claim 17, wherein the second bit can be programmed by creating a large lateral electric field in the channel region between the source and drain, applying a high voltage to the second control gate, and applying a low voltage to the first control gate.

23. The non-volatile memory device of claim 17, wherein the first bit can be erased by band to band hot hole injection, applying a large negative voltage to the first control gate, and applying a low voltage to the second control gate.

24. The non-volatile memory device of claim 17, wherein the second bit can be erased by band to band hot hole injection, applying a large negative voltage to the second control gate, and applying a low voltage to the first control gate.

25. The non-volatile memory device of claim 17, wherein the first bit can be read by applying a high voltage to the source, applying a high voltage to the first control gate, and applying a low voltage to the second control gate and to the drain.

26. The non-volatile memory device of claim 17, wherein the second bit can be read by applying a high voltage to the source, applying a high voltage to the second control gate, and applying a low voltage to the first control gate and to the drain.

* * * * *